(12) United States Patent
Yokoyama et al.

(10) Patent No.: US 11,441,238 B2
(45) Date of Patent: Sep. 13, 2022

(54) SILICON MONOCRYSTAL MANUFACTURING METHOD AND SILICON MONOCRYSTAL PULLING DEVICE

(71) Applicant: SUMCO CORPORATION, Tokyo (JP)

(72) Inventors: Ryusuke Yokoyama, Tokyo (JP); Hideki Sakamoto, Tokyo (JP); Wataru Sugimura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/971,901

(22) PCT Filed: Feb. 27, 2019

(86) PCT No.: PCT/JP2019/007446
§ 371 (c)(1),
(2) Date: Aug. 21, 2020

(87) PCT Pub. No.: WO2019/167990
PCT Pub. Date: Sep. 6, 2019

(65) Prior Publication Data
US 2021/0108337 A1    Apr. 15, 2021

(30) Foreign Application Priority Data

Feb. 28, 2018  (JP) .............................. JP2018-035834

(51) Int. Cl.
*C30B 30/04* (2006.01)
*C30B 15/10* (2006.01)
(Continued)

(52) U.S. Cl.
CPC .............. *C30B 30/04* (2013.01); *C30B 15/10* (2013.01); *C30B 15/20* (2013.01); *C30B 29/06* (2013.01)

(58) Field of Classification Search
CPC ......... C30B 30/04; C30B 29/06; C30B 15/10; C30B 15/20; C30B 15/305; Y10T 117/1032; Y10T 117/1068
See application file for complete search history.

(56) References Cited

U.S. PATENT DOCUMENTS

| | | | | |
|---|---|---|---|---|
| 5,373,805 | A * | 12/1994 | Takano | ................... C30B 15/00 |
| | | | | 117/214 |
| 2003/0068890 | A1* | 4/2003 | Park | ........................ C30B 15/14 |
| | | | | 257/E21.321 |

(Continued)

FOREIGN PATENT DOCUMENTS

| | | |
|---|---|---|
| JP | 5-58771 | 3/1993 |
| JP | 2001-2492 | 1/2001 |

(Continued)

OTHER PUBLICATIONS

IPRP for PCT/JP2019/007446, dated Sep. 1, 2020.
(Continued)

*Primary Examiner* — Robert M Kunemund
(74) *Attorney, Agent, or Firm* — Greenblum & Bernstein, P.L.C.

(57) ABSTRACT

A method of manufacturing monocrystalline silicon by flowing inert gas in a chamber, applying horizontal magnetic field to a silicon melt in a quartz crucible, and pulling up monocrystalline silicon includes: forming a flow distribution of a flow of the inert gas flowing between a lower end of a heat shield and a surface of the silicon melt in the quartz crucible to be plane asymmetric with respect to a plane defined by a crystal pull-up axis of the pull-up device and an application direction of the horizontal magnetic field and rotationally asymmetric with respect to the crystal pull-up axis; maintaining the formed plane asymmetric and rotationally asymmetric flow distribution in a magnetic-field-free state until a silicon material in the quartz crucible is (Continued)

completely melted; and applying the horizontal magnetic field to the completely melted silicon material and starting pulling up the monocrystalline silicon.

7 Claims, 9 Drawing Sheets

(51) Int. Cl.
*C30B 15/20* (2006.01)
*C30B 29/06* (2006.01)

(56) References Cited

U.S. PATENT DOCUMENTS

| | | | | |
|---|---|---|---|---|
| 2007/0240629 | A1* | 10/2007 | Kotooka | C30B 15/14 117/13 |
| 2008/0127886 | A1* | 6/2008 | Sasaki | C30B 35/00 117/217 |
| 2009/0114147 | A1* | 5/2009 | Cho | C30B 15/305 117/32 |
| 2011/0214604 | A1* | 9/2011 | Takano | C30B 15/14 117/13 |
| 2012/0141808 | A1* | 6/2012 | Song | C30B 29/06 428/446 |

FOREIGN PATENT DOCUMENTS

| | | |
|---|---|---|
| JP | 2003-327491 | 11/2003 |
| JP | 2004-83305 | 3/2004 |
| JP | 2004-196655 | 7/2004 |
| JP | 2005-306705 | 11/2005 |
| JP | 2007-284260 A | 11/2007 |
| JP | 2014-227321 | 12/2014 |

OTHER PUBLICATIONS

Official Communication issued in International Bureau of WIPO Patent Application No. PCT/JP2016/007446, dated Apr. 23, 2019.
Office Action for KR App. No. 10-2020-7023551, dated Oct. 29, 2021 (w/ translation).

* cited by examiner

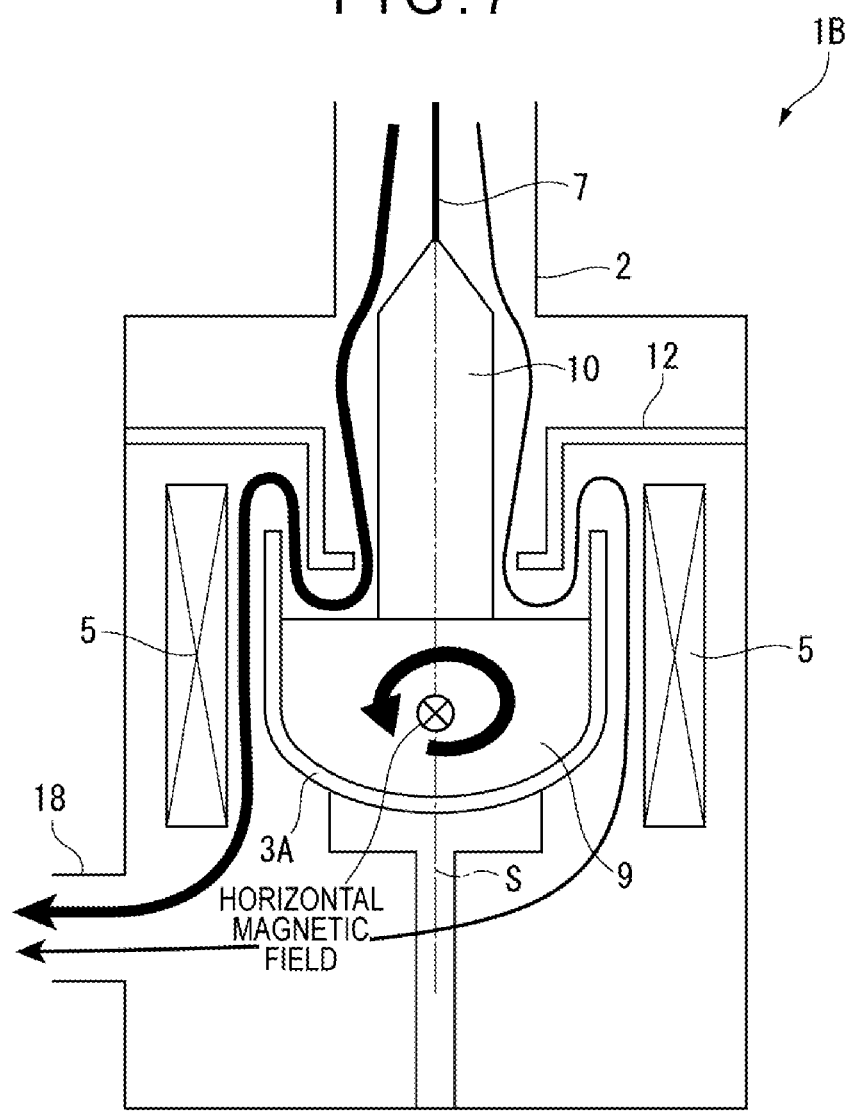

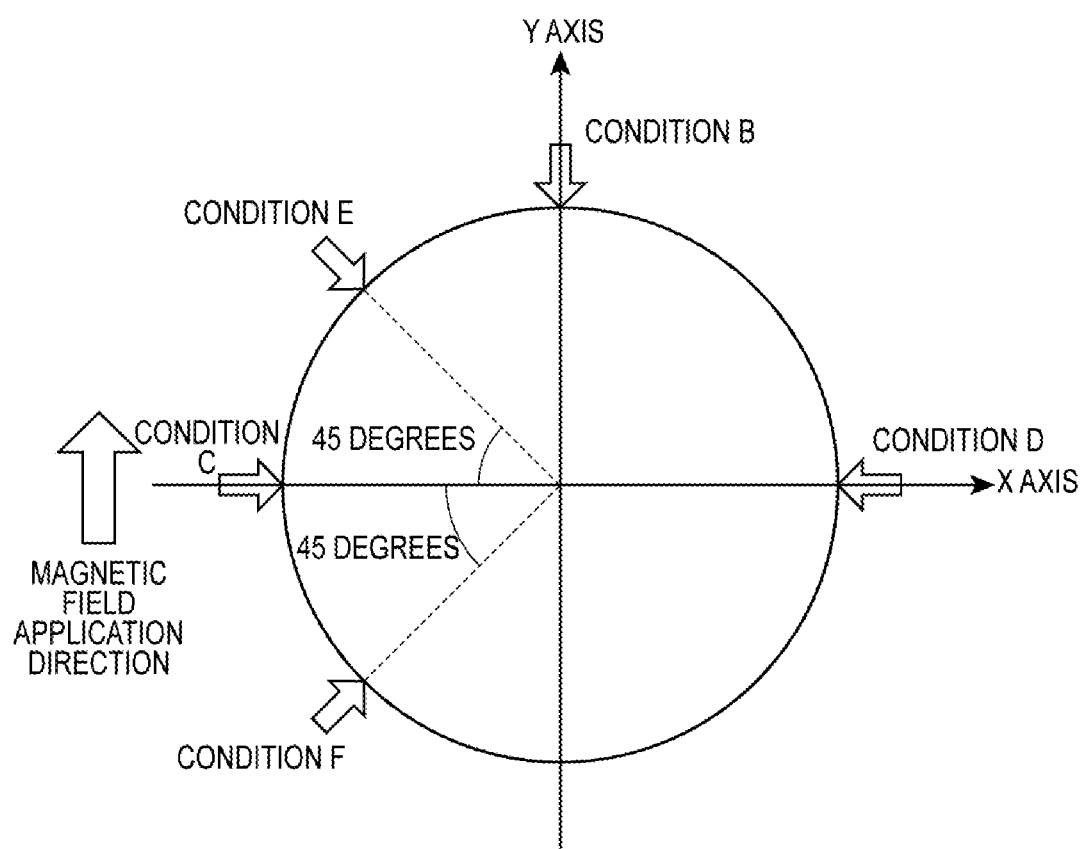

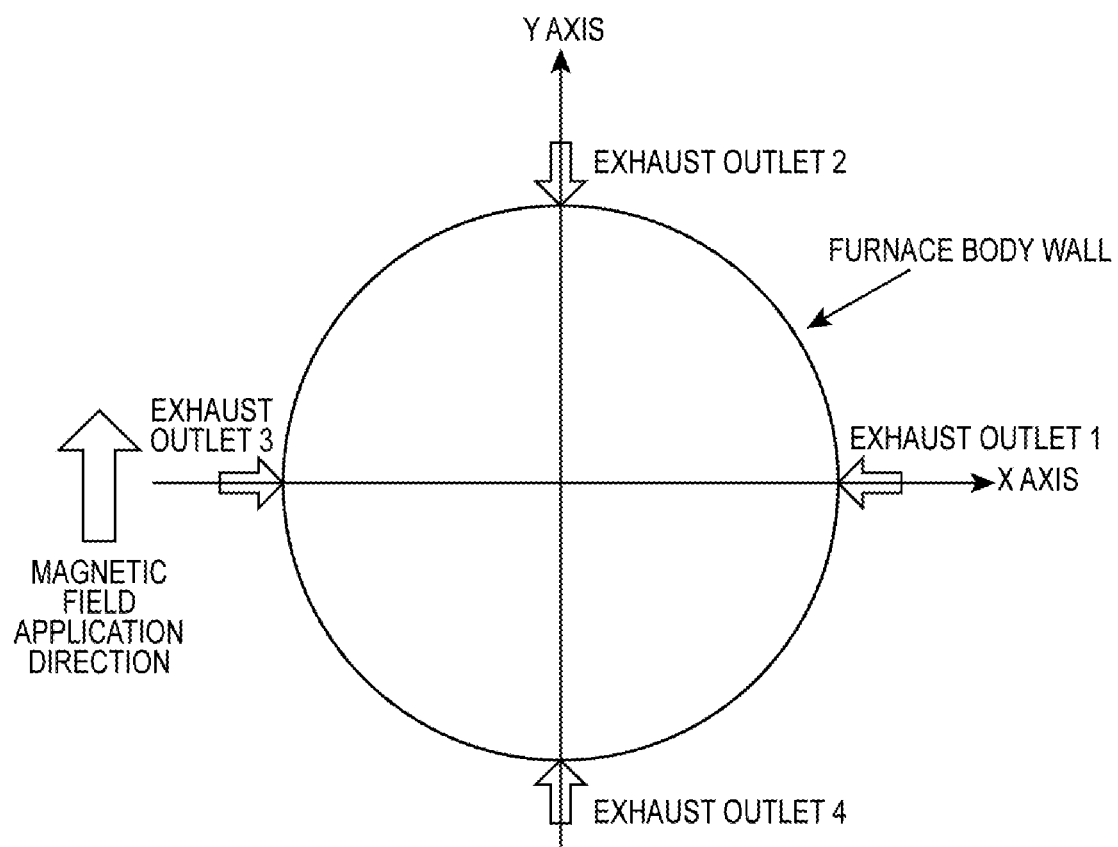

//(1)
SILICON MONOCRYSTAL MANUFACTURING METHOD AND SILICON MONOCRYSTAL PULLING DEVICE

TECHNICAL FIELD

The present invention relates to a manufacturing method of monocrystalline silicon and a pull-up device of monocrystalline silicon.

BACKGROUND ART

Conventionally, it has been proposed that, when monocrystalline silicon is pulled up through a Czochralski process, a horizontal magnetic field is applied while being partially blocked to cause an uneven density of magnetic field lines, or a crystal pull-up axis is offset with respect to a rotation center of a quartz crucible (see, for instance, Patent Literature 1).

CITATION LIST

Patent Literature(S)

Patent Literature 1 JP 2004-196655 A

SUMMARY OF THE INVENTION

Problem(s) to be Solved by the Invention

In recent years, it has become known that, even when monocrystalline silicon is pulled up through the Czochralski process while being applied with a horizontal magnetic field using the same pull-up device under the same pull-up conditions, qualities of the pulled-up monocrystalline silicon (especially an oxygen concentration) are polarized (i.e. not constant but divided into two separate groups).

However, the technology described in Patent Literature 1, which does not recognize occurrence of such polarization at all, cannot solve the polarization.

An object of the invention is to provide a method of manufacturing monocrystalline silicon having constant qualities by preventing polarization in an oxygen concentration in the monocrystalline silicon, and a pull-up device of the monocrystalline silicon.

Means for Solving the Problem(s)

According to an aspect of the invention, a manufacturing method of monocrystalline silicon with use of a pull-up device, the pull-up device including: a chamber; a quartz crucible disposed in the chamber; and a heat shield covering an upper part of the quartz crucible, the monocrystalline silicon being pulled up by flowing inert gas into the chamber, and applying a horizontal magnetic field to a silicon melt in the quartz crucible; and pulling up monocrystalline silicon, the method includes: forming a flow distribution of a flow of the inert gas flowing between a lower end of the heat shield and a surface of the silicon melt in the quartz crucible, the flow distribution being plane asymmetric with respect to a plane defined by a crystal pull-up axis of the pull-up device and an application direction of the horizontal magnetic field and being rotationally asymmetric with respect to the crystal pull-up axis; maintaining the formed plane asymmetric and rotationally asymmetric flow distribution in a magnetic-field-free state until a silicon material in the quartz crucible is completely melted; and applying the horizontal magnetic field to the completely melted silicon material and starting pulling up the monocrystalline silicon.

The flow distribution of the inert gas between the lower end of the heat shield and the surface of the silicon melt is formed to be plane asymmetric and rotationally asymmetric, whereby the convection flow in the silicon melt can be controlled to be clockwise or anticlockwise with respect to the direction of the horizontal magnetic field. Accordingly, by keeping this state, it can be judged whether the convection flow in the silicon melt is anticlockwise or clockwise. The horizontal magnetic field is applied in this state to fix the convection flow in the silicon melt, during which the monocrystalline silicon can pulled up. Accordingly, the monocrystalline silicon having stable qualities can be pulled up without polarization of the oxygen concentration in the pulled up monocrystalline silicon.

In the above aspect of the invention, it is preferable that the monocrystalline silicon is pulled up without decreasing an intensity of the horizontal magnetic field below a predetermined value after the pulling up of the monocrystalline silicon is started until the pulling up of the monocrystalline silicon is completed.

Unless the intensity of the horizontal magnetic field falls below a predetermined value until the pulling up of the monocrystalline silicon is completed, the monocrystalline silicon can be pulled up while the convection flow inside the silicon melt can be fixed. Accordingly, the monocrystalline silicon is pulled up while the convection flow in the silicon melt is kept in a predetermined state, so that the monocrystalline silicon having stable qualities can be pulled up without polarization.

A pull-up device is configured to conduct the above manufacturing method of monocrystalline silicon, in which the heat shield of the pull-up device is plane asymmetric with respect to the plane defined by the crystal pull-up axis and the application direction of the horizontal magnetic field and is rotationally asymmetric with respect to the crystal pull-up axis.

Since the heat shield is plane asymmetric with respect to the plane defined by the crystal pull-up axis and the magnetic-field application direction and is rotationally asymmetric with respect to the crystal pull-up axis, the inert gas flow can be made plane asymmetrically and rotationally asymmetrically distributed with respect to the crystal pull-up axis between a plane asymmetric part and parts other than the plane asymmetric part. Accordingly, the manufacturing method of the monocrystalline silicon can be performed by only changing the structure of the pull-up device.

In the pull-up device according to the above aspect of the invention, the pull-up device includes an exhaust outlet for exhausting the inert gas, and the exhaust outlet is asymmetrically configured with respect to the crystal pull-up axis.

The asymmetric shape of the exhaust outlet with respect to the crystal pull-up axis enables the flow distribution of the flow of the inert gas between the lower end of the heat shield and the surface of the silicon melt to be made plane asymmetric and rotationally asymmetric. Accordingly, the manufacturing method of the monocrystalline silicon can also be performed with this simple structure.

BRIEF DESCRIPTION OF DRAWING(S)

FIG. 1 is an illustration for explaining a background for the invention.

FIG. 2 schematically shows a cross section of a pull-up device according to a first exemplary embodiment of the invention.

FIG. 3 schematically shows a plan view of the pull-up device in the exemplary embodiment.

FIG. 4 is a flowchart showing a manufacturing method of monocrystalline silicon of the invention.

FIG. 5 schematically shows a plan view of a heat shield of a pull-up device of monocrystalline silicon according to a second exemplary embodiment of the invention.

FIG. 6 schematically shows a cross section of a pull-up device of monocrystalline silicon according to a third exemplary embodiment of the invention.

FIG. 7 schematically shows a cross section of a pull-up device of monocrystalline silicon according to a fourth exemplary embodiment of the invention.

FIG. 8 is a schematic plan of a cut formation position in Example of the invention.

FIG. 9 is a schematic plan showing positions of exhaust outlets in Example of the invention.

DESCRIPTION OF EMBODIMENT(S)

Exemplary embodiments of the invention will be described below with reference to the attached drawings.

[1] Background of Invention

The inventors have known that, even when the monocrystalline silicon is pulled up using the same pull-up device under the same pull-up conditions, an oxygen concentration of the pulled-up monocrystalline silicon may sometimes become high or low. In order to solve this problem, a research has been typically focused on the pull-up conditions and the like. However, no definitive solution has been found.

Figure 1:
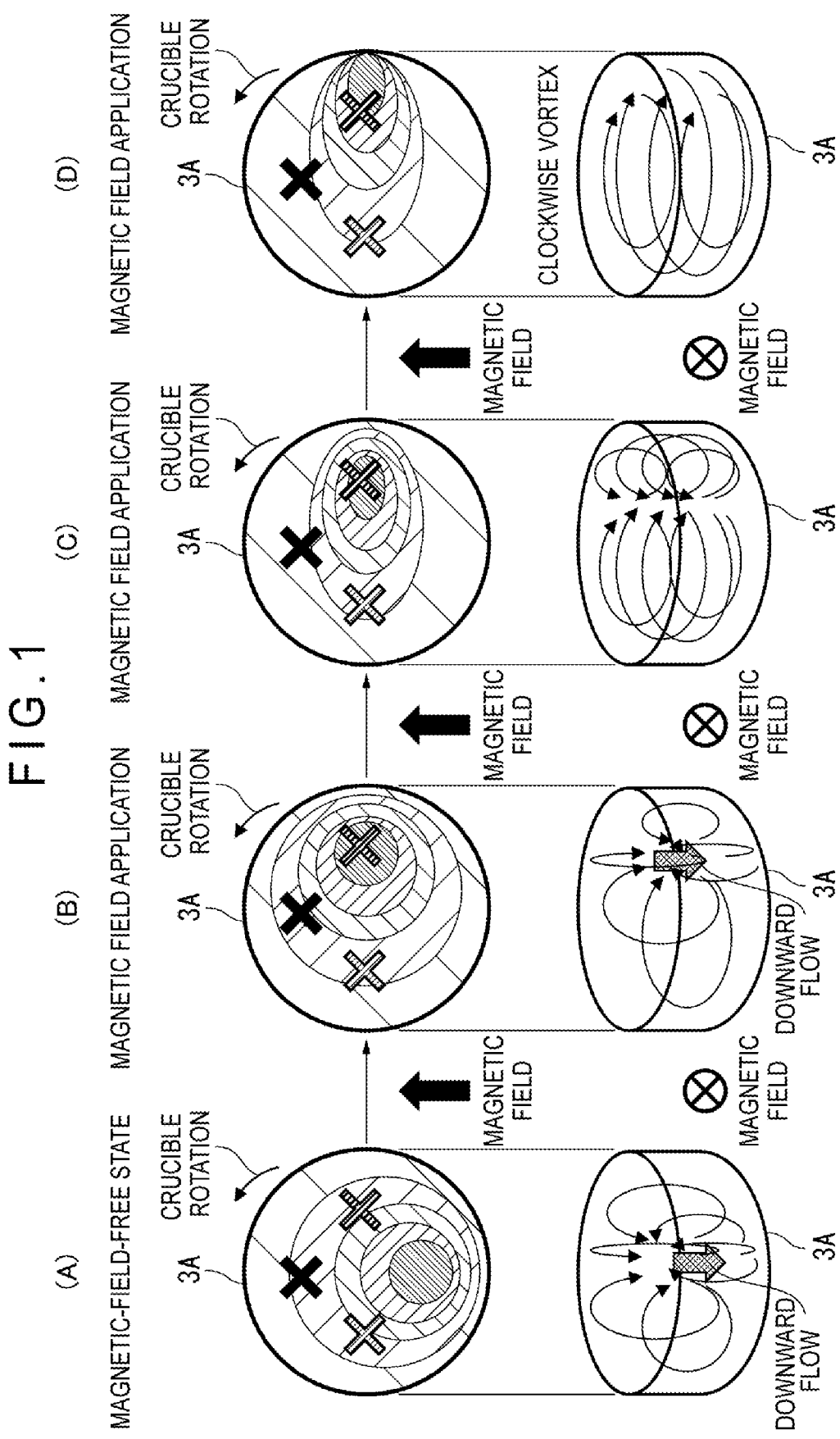

After further research, the inventors have found that, when a solid polycrystalline silicon feedstock is put into a quartz crucible 3A to be melted therein and monocrystalline silicon 10 is pulled up while being applied with a horizontal magnetic field as shown in FIG. 1, a convection flow rotating in a direction from the bottom of the quartz crucible 3A toward a surface of a silicon melt around magnetic field lines of the horizontal magnetic field is observed. The rotation direction of the convection flow is categorized into two convection patterns of a case where a clockwise rotation is dominant and a case where an anticlockwise rotation is dominant.

The inventors have speculated that the occurrence of such a phenomenon is due to the following mechanism.

First, as shown in FIG. 1(A), while the horizontal magnetic field is not applied and the quartz crucible 3A is not rotated, a silicon melt 9 is heated in the vicinity of an outer periphery of the quartz crucible 3A to cause a convection flow in an ascending direction from the bottom of the silicon melt 9 toward the surface thereof. The ascending silicon melt 9, which is cooled at the surface 9A of the silicon melt 9, returns to the bottom of the quartz crucible 3A at the center of the quartz crucible 3A, causing a downward convection flow.

When the convection flow that ascends in the outer periphery and descends at the center thereof occurs, a position of the downward flow randomly shifts to be offset from the center due to instability of thermal convection as shown in FIG. 1(A).

In the state of FIG. 1(A), when the horizontal magnetic field is applied, rotation of the downward flow, which is gradually restrained as viewed from above the quartz crucible 3A, is restrained at a position offset from a position of a central magnetic field line of the horizontal magnetic field as shown in FIG. 1(B).

When the intensity of the horizontal magnetic field is further increased with this state kept, the magnitude of the convection flow in the ascending direction on the right side and the left side of the downward flow changes as shown in FIG. 1 (C), where the upward convection flow on the left side of the downward flow becomes dominant.

Finally, the convection flow in the ascending direction on the right side of the downward flow disappears as shown in FIG. 1(D), where the convection flow flows upward (i.e. in the ascending direction) on the left side and downward (i.e. in the descending direction) on the right side to create a clockwise convection flow.

In contrast, if a start position of the downward flow in FIG. 1(A) is shifted in phase by 180 degrees in the rotation direction of the quartz crucible 3A, the downward flow is restrained at a position on the left side where a phase is shifted by 180 degrees from that in FIG. 1(C), resulting in an anticlockwise convection flow.

Oxygen eluted from the quartz crucible is delivered by the convection of the silicon melt to a growing solid-liquid interface and is captured into the monocrystalline silicon. If thermal environment inside the pull-up device is completely axisymmetric and process conditions are the same, an amount of oxygen absorbed into the monocrystalline silicon is constant irrespective of the direction of the vortex (i.e. clockwise or anticlockwise).

However, an oxygen flux amount delivered by the clockwise vortex is different from that by the anticlockwise vortex due to non-uniformness of the thermal environment caused by an asymmetric configuration of a furnace, inaccuracy in locations of components of the furnace even with a symmetric configuration in design, and the like.

Consequently, the monocrystalline silicon having a different oxygen concentration is manufactured depending on the convection mode (i.e. clockwise vortex or the anticlockwise vortex). Since the oxygen concentration of the grown monocrystalline silicon is different depending on the convection mode even when the monocrystalline silicon is grown with the same pull-up device under the same process conditions, the convection mode adversely affects oxygen controllability and significantly reduces a yield of the monocrystalline silicon.

Accordingly, one of the two convection modes should better be set as a target convection mode before the growth of the monocrystalline silicon and the monocrystalline silicon should better be grown while the target convection mode is kept.

As a result of examining a behavior of the convection mode with a radiation thermometer during the pulling up of the monocrystalline silicon, it has been revealed that the convection mode is determined when a magnetic field is applied, and the once determined convection mode continues until an end of a tail of the monocrystalline silicon is formed without transiting to the other mode unless the magnetic field is turned off. Accordingly, if the convection mode can be selected through any method when a magnetic field is applied, the subsequent mode during the pulling up of the monocrystalline silicon is fixed, and qualities of the monocrystalline silicon are also determined according to the selected mode.

In light of the above findings, the inventors have intentionally asymmetrically configured the pulling device, and controlled the oxygen concentration in the monocrystalline silicon to be constant by an unbalanced distribution (flow distribution) of the flow of the inert gas on the surface of the silicon melt caused by the asymmetric configuration.

[2] First Exemplary Embodiment

Figure 2:
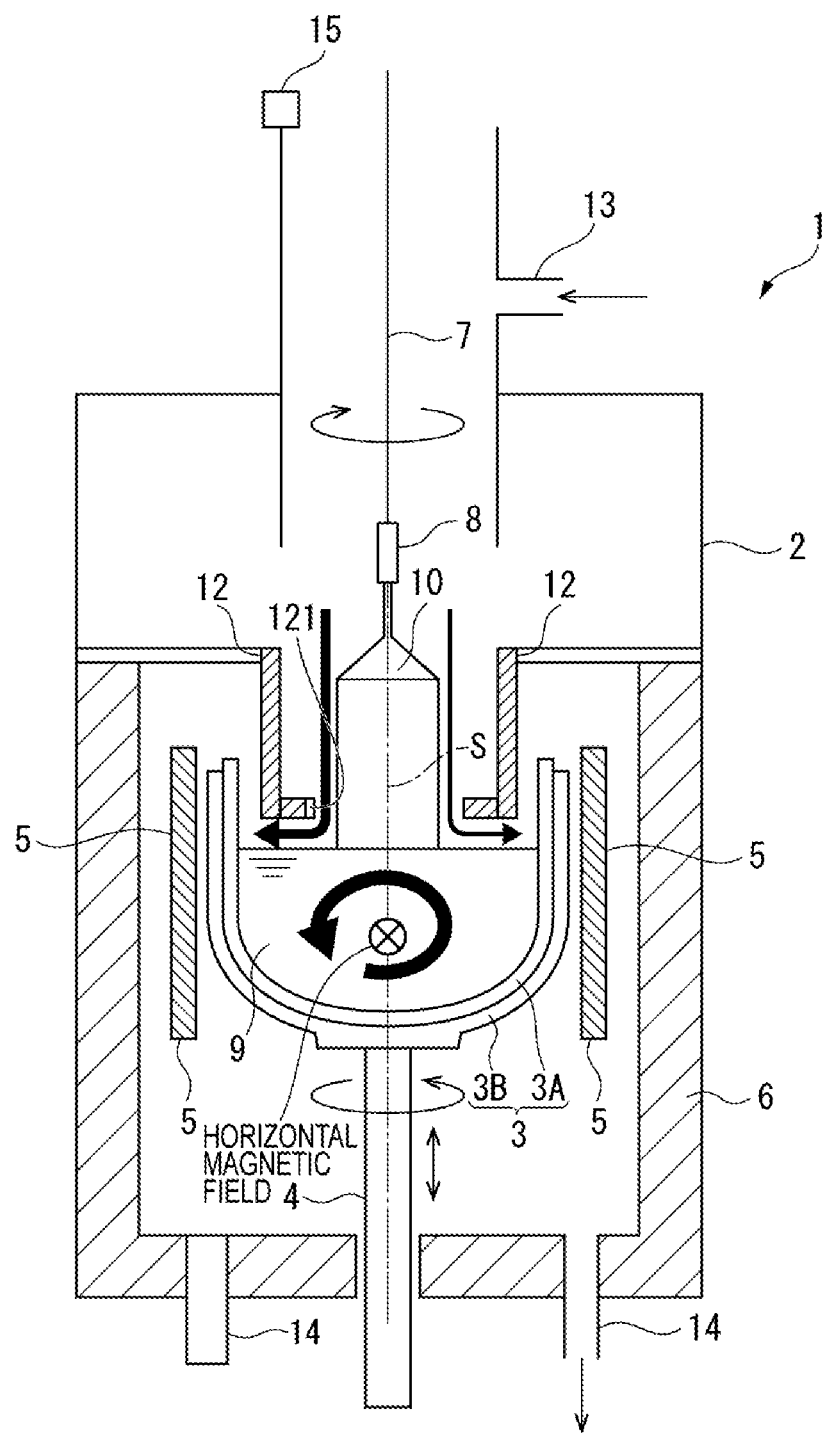
Figure 3:
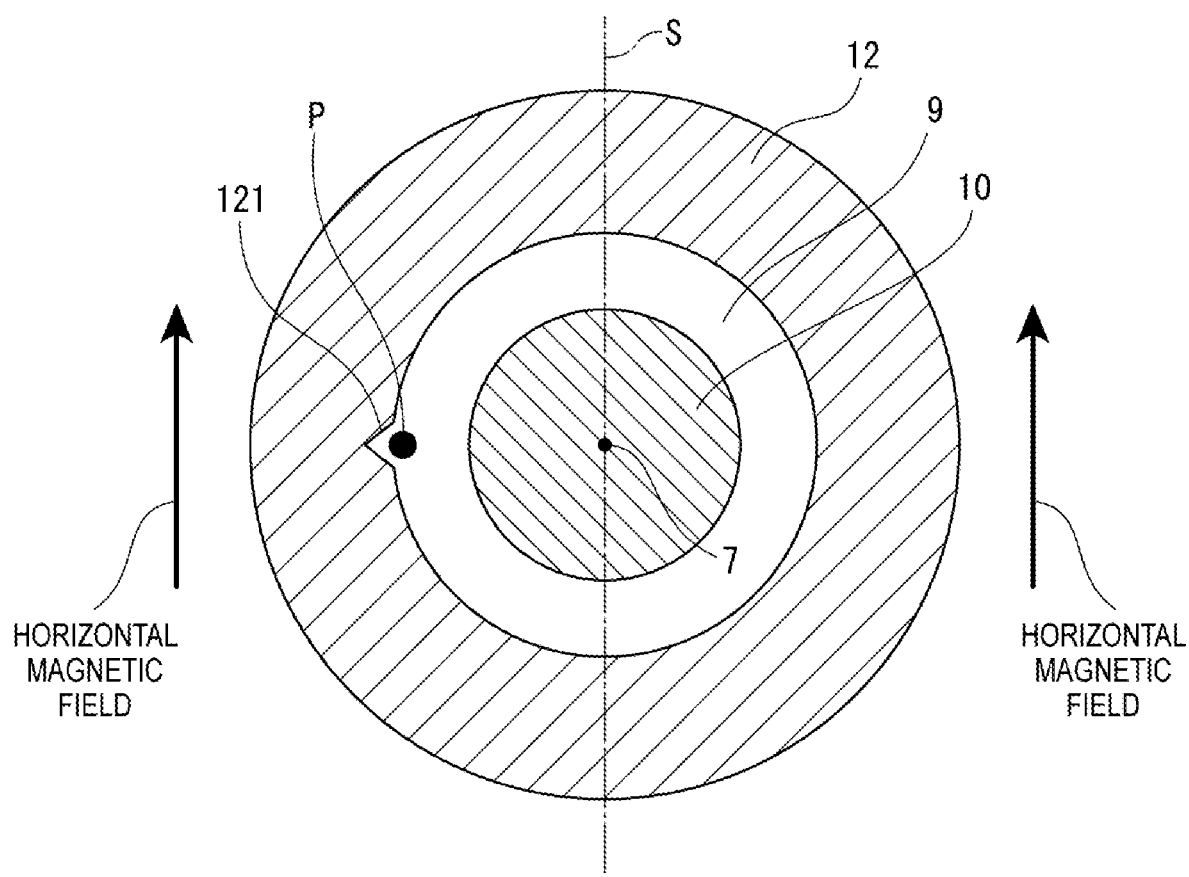

FIGS. 2 and 3 schematically illustrate an exemplary structure of a pull-up device 1 of monocrystalline silicon to which a manufacturing method of monocrystalline silicon 10 according to a first exemplary embodiment of the invention is applicable. The pull-up device 1, which is a device for pulling up the monocrystalline silicon 10 through the Czochralski method, includes a chamber 2 forming an outer shell and a crucible 3 disposed at the center of the chamber 2.

The crucible 3, which has a double structure of an inner quartz crucible 3A and an outer graphite crucible 3B, is fixed to an upper end of a support shaft 4 that is rotatable and movable up and down.

A resistance heating type heater 5 is provided outside the crucible 3 in a manner to surround the crucible 3. A heat insulation material 6 is provided outside the heater 5 and along an inner surface of the chamber 2.

A crystal pull-up axis 7 (e.g., a wire), which is coaxial with the support shaft 4 and configured to rotate at a predetermined speed in a direction opposite to or the same as the rotation direction of the support shaft 4, is provided above the crucible 3. A seed crystal 8 is attached to a lower end of the crystal pull-up axis 7.

The heat shield 12, which shields the growing monocrystalline silicon 10 from high-temperature radiation heat from the silicon melt 9 in the crucible 3, the heater 5 and a side wall of the crucible 3, prevents outward heat diffusion from a solid-liquid interface (i.e. an interface on which crystal grows) and a vicinity thereof, whereby the heat shield 12 serves to control a temperature gradient of a central portion and an outer peripheral portion of the monocrystalline silicon in a direction of the pull-up shaft.

Moreover, the heat shield 12 also serves as a current regulation cylinder for exhausting substances evaporated from the silicon melt 9 to the outside of the furnace by inert gas introduced from the top of the furnace.

A gas inlet 13, through which an inert gas (e.g. Argon gas (also referred to as Ar gas hereinafter)) is introduced into the chamber 2, is provided at an upper part of the chamber 2. An exhaust outlet 14, through which the gas in the chamber 2 is sucked and discharged when a vacuum pump (not shown) is driven, is provided at a lower part of the chamber 2.

The inert gas introduced in the chamber 2 through the gas inlet 13, which flows downward between the growing monocrystalline silicon 10 and the heat shield 12 and then flows into a space between a lower end of the heat shield 12 and a liquid surface of the silicon melt 9, flows toward an outside of the heat shield 12 and an outside of the crucible 3 and then downward along the outside of the crucible 3, to be discharged from the exhaust outlet 14.

A horizontal magnetic field is applied to the pull-up device 1. Magnetic field lines of the horizontal magnetic field extend in an orthogonal direction to the sheet of FIG. 2. A cut 121, which has a structure that is plane asymmetric with respect to a plane S defined by the crystal pull-up axis 7 and an application direction of the horizontal magnetic field and that is rotationally asymmetric with respect to the crystal pull-up axis 7 as shown in FIG. 3, is formed on the heat shield 12. In other words, the formation of the cut 121 on the heat shield 12 enables a flow distribution of a flow of inert gas between a lower end of the heat shield 12 and a surface of the silicon melt 9 in the quartz crucible 3A to be plane asymmetric and rotationally asymmetric with respect to the crystal pull-up axis 7.

Moreover, a radiation thermometer 15, which is disposed immediately above the cut 121 and above the chamber 2 as shown in FIG. 2, is configured to measure a surface temperature of the silicon melt 9 at a measurement point P in a non-contact manner near the cut 121 as shown in FIG. 3.

Ar gas is supplied from the gas inlet 13 onto the surface of the silicon melt 9 and flows along the liquid surface thereof toward an outside of the quartz crucible 3A. At this time, a flow rate of the Ar gas flowing through the cut 121, which is increased to generate a large volume of the Ar gas flow due to an increased space of the cut 121, becomes larger than a flow rate of the Ar gas in the rest. In contrast, the flow rate of the Ar gas flowing through the part where no cut is formed is decreased since the space is kept small.

Figure 4:
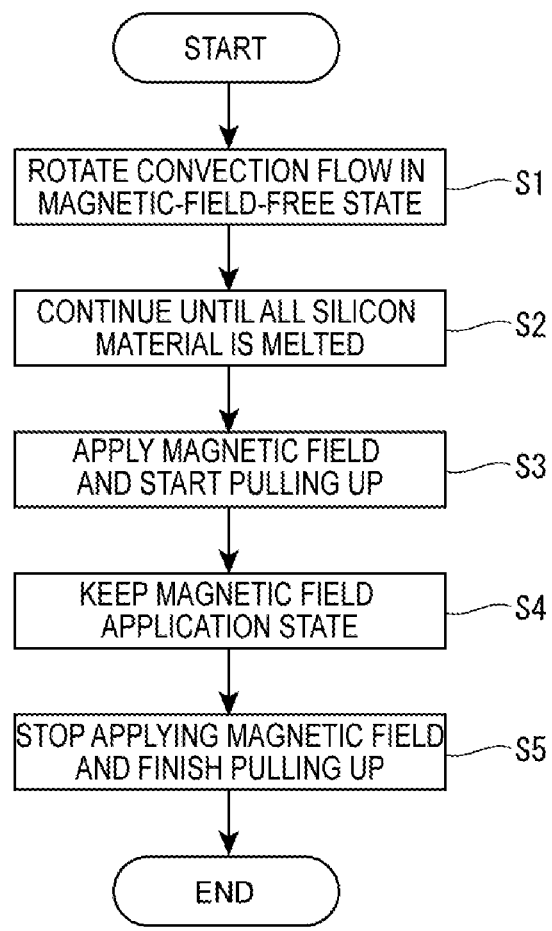

The manufacturing method of monocrystalline silicon 10 using the above-described pull-up device 1 will be described with reference to the flowchart shown in FIG. 4.

Firstly, a convection flow for monocrystalline silicon 10 is generated and the quartz crucible 3A is rotated in a magnetic-field-free state, thereby rotating the convection flow in upward and downward directions around the crystal pull-up axis 7 (Step S1: state shown in FIG. 1(A)).

This state is maintained until all the silicon material is melted (Step S2).

After all the silicon material is melted, a horizontal magnetic field is applied to the silicon melt to restrain a movement of the convection flow. As shown in FIG. 2, after an anticlockwise convention flow in the silicon melt 9 is aligned with the location of the cut 121, and the monocrystalline silicon 10 starts being pulled up (Step S3: state shown in FIG. 1(D)).

During the growth of the monocrystalline silicon 10, the pulling up of a straight body of the monocrystalline silicon 10 continues with an intensity of the horizontal magnetic field being kept at least at 0.2 T or more (Step S4).

When a tail of the monocrystalline silicon 10 is fully pulled up, the application of the horizontal magnetic field is stopped to finish the pulling up (Step S5).

The above exemplary embodiment offers the following advantages.

The flow distribution of the flow of Ar gas between the lower end of the heat shield 12 and the surface of the silicon melt 9 is made plane asymmetric with respect to the crystal pull-up axis 7 and the application direction of the horizontal magnetic field and rotationally asymmetric with respect to the crystal pull-up axis 7, whereby the convection flow in the silicon melt 9 can be controlled to be clockwise or anti-clockwise with respect to the direction of the horizontal magnetic field. Accordingly, by keeping this state, it can be judged whether the convection flow in the silicon melt 9 is anticlockwise or clockwise. The horizontal magnetic field is applied in this state to fix the convection flow in the silicon melt, during which the monocrystalline silicon can pulled up. Accordingly, the monocrystalline silicon can be pulled up without polarization of the oxygen concentration in the pulled up monocrystalline silicon.

Unless the intensity of the horizontal magnetic field falls below a predetermined value until the completion of the monocrystalline silicon 10, the monocrystalline silicon 10 can be pulled up while the convection flow inside the silicon melt 10 is restrained. Accordingly, the monocrystalline silicon is pulled up while the convection flow in the silicon melt is kept in a predetermined state, so that the monocrystalline silicon can be pulled up without polarization.

Since the heat shield 12 is plane asymmetrically configured with respect to the plane defined by the crystal pull-up axis 7 and the magnetic-field application direction and is rotationally asymmetric with respect to the crystal pull-up axis 7, the Ar gas flow distribution of the plane asymmetric part and the rest part can be made plane asymmetric and rotationally asymmetric with respect to the crystal pull-up axis 7. Accordingly, the manufacturing method of the monocrystalline silicon can be performed by only changing the structure of the pull-up device 1.

The invention is not limited to the above arrangement. For instance, in some embodiments, the distance between the surface of the silicon melt 9 and the lower end of the heat shield is partially changed in order to achieve the plane asymmetric Ar gas flow distribution with respect to the plane defined by the crystal pull-up axis 7 and the application direction of the horizontal magnetic field and the rotationally asymmetric Ar gas flow distribution with respect to the crystal pull-up axis 7.

With this arrangement, since the flow rate of the Ar gas is increased at the part where the distance between the surface of the silicon melt 9 and the lower end of the heat shield is large and is decreased at the part where the distance therebetween is small, the same functions and advantages as those in the first exemplary embodiment can be provided.

[3] Second Exemplary Embodiment

Next, a second exemplary embodiment of the invention will be described. In the following description, the same reference numerals will be given to the components already described and the description thereof will be omitted.

In the first exemplary embodiment, the cut 121 is formed to the heat shield 12, thereby providing the heat shield 12 plane asymmetric with respect to the plane S defined by the crystal pull-up axis 7 and the application direction of the horizontal magnetic field, and rotationally asymmetric with respect to the crystal pull-up axis 7.

Figure 5:
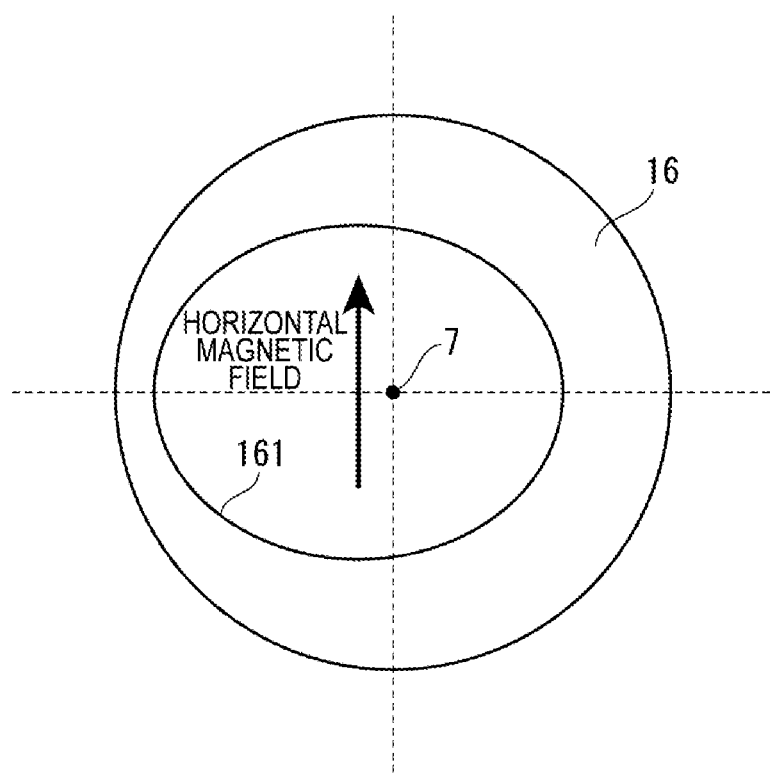

In contrast, the plane asymmetric structure in the exemplary embodiment is different in that a bore 161 of a heat shield 16 through which monocrystalline silicon passes is formed in an eccentric elliptical shape as shown in FIG. 5. An area of a left region in the bore 161 with respect to the plane defined by the application direction of the horizontal magnetic field and the crystal pull-up axis 7 is larger while the bore 161 is rotationally asymmetric with respect to the crystal pull-up axis 7, in the same manner as in the first exemplary embodiment.

The second exemplary embodiment as described above can also provide the same functions and advantages as in the first exemplary embodiment.

[4] Third Exemplary Embodiment

In the above-described first exemplary embodiment, the heat shield 12 is made plane asymmetric with respect to the plane defined by the application direction of the horizontal magnetic field and the crystal pull-up axis.

Figure 6:
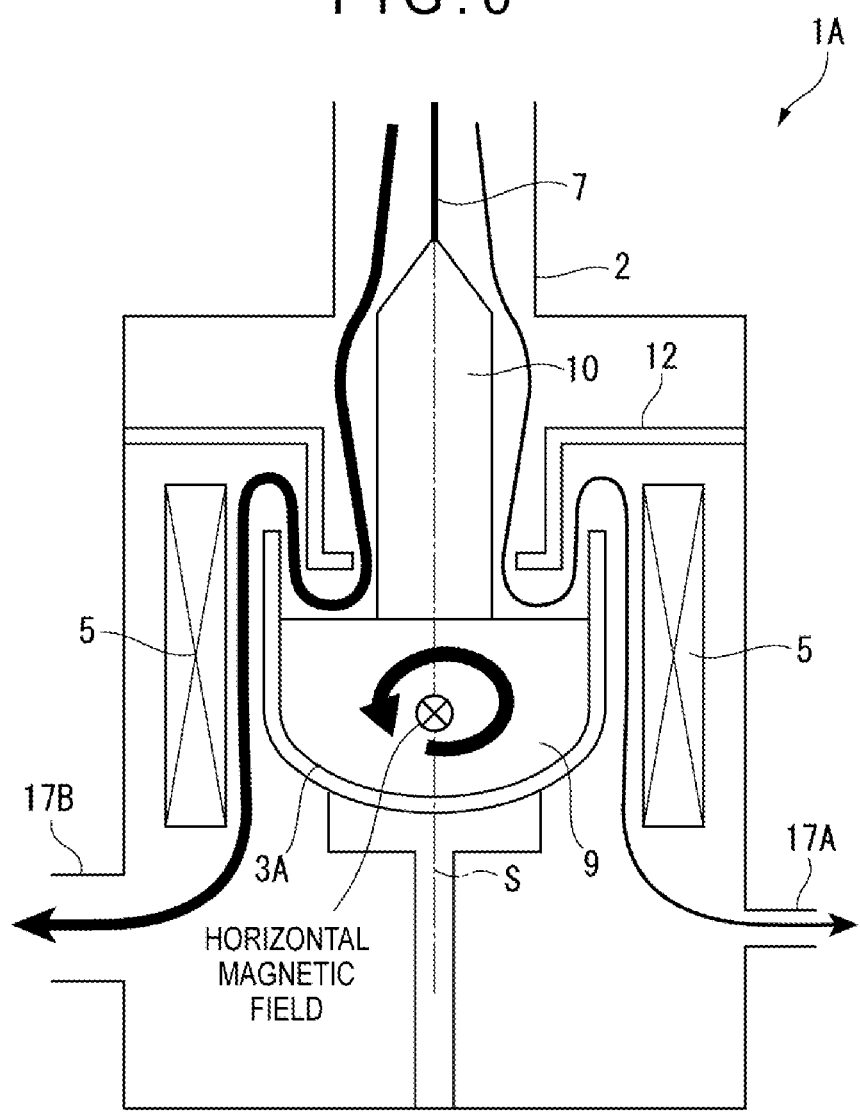

In a third exemplary embodiment, two exhaust outlets 17A, 17B, which are symmetric to each other with respect to the plane defined by the crystal pull-up axis 7 and the application direction of the horizontal magnetic field, are provided at a lower portion of the chamber 2 of a pull-up device 1A as shown in FIG. 6. However, the third exemplary embodiment is different from the first exemplary embodiment in that an exhaust area of the exhaust outlet 17B is larger than an exhaust area of the exhaust outlet 17A.

Since the exhaust volume from the exhaust outlet 17B can be increased with the above arrangement, the Ar gas flow distribution is made plane asymmetric with respect to the plane defined by the crystal pull-up axis 7 and the application direction of the horizontal magnetic field and is made rotationally asymmetric with respect to the crystal pull-up axis 7. Accordingly, the third exemplary embodiment can also provide the same functions and advantages as in the first exemplary embodiment.

[5] Fourth Exemplary Embodiment

In the above-described third exemplary embodiment, two exhaust outlets 17A are provided at the lower portion of the chamber 2 of the pull-up device 1A.

In contrast, the fourth exemplary embodiment is different from the third exemplary embodiment in that a single exhaust outlet 18 is provided at a single position of one side of the lower portion of the chamber 2 of a pull-up device 1B as shown in FIG. 7.

Since Ar gas is exhausted only from the single exhaust outlet 18, the exhaust volume of Ar gas is increased on the side of the chamber 2 where the exhaust outlet 18 is provided, whereas the exhaust volume of Ar gas is decreased on the opposite side of the chamber 2.

Also with this arrangement, the Ar gas flow distribution is made plane asymmetric with respect to the plane defined by the crystal pull-up axis 7 and the application direction of the horizontal magnetic field and is made rotationally asymmetric with respect to the crystal pull-up axis 7. Accordingly, the fourth exemplary embodiment can also provide the same functions and advantages as in the first exemplary embodiment.

EXAMPLE(S)

Next, Examples of the invention will be described. It should be noted that the invention is by no means limited to Examples.

Example 1

A 400-kg silicon material was fed into a 32-inch quartz crucible 3A and was completely melted. Subsequently, a platform holding the quartz crucible was vertically moved such that the distance between the surface of the silicon melt 9 and the lower end of the heat shield 12 was 30 mm, the crucible was stopped rotating, and the flow rate of Argon was set at 150 L/min. After this state was kept for one hour, a horizontal magnetic field was applied to the silicon melt 9 and it was checked whether a convection mode of the silicon melt 9 was a clockwise vortex or an anticlockwise vortex.

The test was tried 10 times each under a plurality of conditions in which the shape of the heat shield 12 and the installation position thereof were changed. In condition A, an axisymmetric heat shield was used. In Condition B, a cutout shape was added to the heat shield 12 of Condition A, and the heat shield 12 was installed such that the position of the cut 121 was set so as to be directed in the same direction as the application direction of the horizontal magnetic field as shown in FIG. 8. In Condition C and Condition D, the heat shield of Condition B was installed such that the cut positions in Condition C and Condition D were respectively located at 90 degrees on the left side and 90 degrees on the right side when facing the application direction of the horizontal magnetic field. In Condition E and Condition F, the heat shield of Condition B was installed such that the cut positions in Condition E and Condition F were respectively located at 45 degrees on the left side and 135 degrees on the left side when facing the application direction of the horizontal magnetic field as shown in FIG. 8. Table 1 shows occurrence rate of an anticlockwise vortex and a simulated vortex in Condition A to Condition F.

TABLE 1

|  | Probability of Anticlockwise Vortex | Probability of Clockwise Vortex |
|---|---|---|
| Condition A | 50% | 50% |
| Condition B | 50% | 50% |
| Condition C | 100% | 0% |
| Condition D | 0 | 100% |
| Condition E | 90% | 10% |
| Condition F | 90% | 10% |

In Condition A and Condition B, an anticlockwise vortex and a clockwise vortex occur at 50%, that is, it is virtually random which convection mode occurs. In other words, the convection mode was not controlled under Condition A (conventional condition) and Condition B (plane symmetric shape).

In contrast, the convection mode is an anticlockwise vortex under Condition C at 100% probability, and is a clockwise vortex under Condition D at 100% probability. The convection mode is an anticlockwise vortex under Condition E and Condition F at a probability as high as 90%. In other words, it has been confirmed that the anticlockwise vortex and the clockwise vortex can be freely selected by imparting a plane asymmetric and rotationally asymmetric configuration (e.g., cut 121) to the heat shield 12. It has also been confirmed that the probability of achieving a desired convection mode is increased as the heat shield becomes more highly plane asymmetric.

Example 2

Next, in a furnace with the heat shield 12 used under Condition A in Example 1, a test was conducted in the same manner as in Example 1 by changing the shape, the positions and the number of a plurality of exhaust outlets 14 present on a side wall of a furnace body. The furnace body used for the test was installed with cylindrical exhaust outlet 1 to exhaust outlet 4 at four position of the wall of the furnace body as shown in FIG. 9. An inner diameter of each of the exhaust outlets 14 was changed as shown in Table 2. It should be noted that zero (0) in Table 2 represents removal of the exhaust outlet 14.

TABLE 2

|  | Exhaust Outlet 1 | Exhaust Outlet 2 | Exhaust Outlet 3 | Exhaust Outlet 4 |
|---|---|---|---|---|
|  |  |  |  | unit: mm |
| Condition A | 20 | 20 | 20 | 20 |
| Condition G | 10 | 20 | 20 | 20 |
| Condition H | 20 | 10 | 20 | 20 |
| Condition I | 20 | 20 | 10 | 20 |
| Condition J | 20 | 20 | 20 | 10 |
| Condition K | 20 | 0 | 0 | 0 |
| Condition L | 0 | 0 | 20 | 0 |

Under Condition A, all four exhaust outlets each had a diameter of 20 mm, which is the same as Condition A of Example 1. Under Conditions G, H, I and J, the respective exhaust outlets 1, 2, 3 and 4 were set to have a 10-mm diameter, whereby the exhaust volume was decreased. Under Condition K and Condition L, the respective exhaust outlets 1 and 3 were left while the other three exhaust outlets 14 were removed. Table 3 shows occurrence rates of the anticlockwise vortex and the clockwise vortex under each of the conditions.

TABLE 3

|  | Probablity of Anticlockwise Vortex | Probablity of Clockwise Vortex |
|---|---|---|
| Condition A | 50% | 50% |
| Condition G | 60% | 40% |
| Condition H | 50% | 50% |
| Condition I | 40% | 60% |
| Condition J | 50% | 50% |
| Condition K | 0% | 100% |
| Condition L | 100% | 0% |

In Condition A, Condition H and Condition J, an anticlockwise vortex and a clockwise vortex occur at 50%, that is, it is virtually random which convection mode occurs. In other words, the convection mode was not controlled under Condition A (conventional condition), and Conditions H and J (plane symmetric shape).

In contrast, an occurrence rate of the anticlockwise vortex is slightly higher than that of the clockwise vortex under Condition G, and an occurrence rate of the clockwise vortex is higher than that of the anticlockwise vortex under Condition I. Further, a clockwise vortex occurs under Condition K at 100% probability and an anticlockwise vortex occurs under Condition L at 100% probability. In other words, it has been confirmed that the convection mode can be freely selected from the anticlockwise vortex and the clockwise vortex also by making the exhaust structure non-axisymmetric and making the flow rate of argon flowing between the heat shield and the silicon melt non-axisymmetric.

The invention claimed is:

1. A manufacturing method of monocrystalline silicon with use of a pull-up device, the pull-up device comprising:
   a chamber;
   a quartz crucible disposed in the chamber; and
   a heat shield covering an upper part of the quartz crucible,
   the monocrystalline silicon being pulled up by flowing inert gas into the chamber, and applying a horizontal magnetic field to a silicon melt in the quartz crucible; and pulling up monocrystalline silicon,
   the method comprising:
      forming a flow distribution of a flow of the inert gas flowing between a lower end of the heat shield and a surface of the silicon melt in the quartz crucible, the flow distribution being plane asymmetric with respect to a plane defined by a crystal pull-up axis of the pull-up device and an application direction of the horizontal magnetic field and being rotationally asymmetric with respect to the crystal pull-up axis;
      maintaining the formed plane asymmetric and rotationally asymmetric flow distribution in a magnetic-field-free state until a silicon material in the quartz crucible is completely melted; and
      applying the horizontal magnetic field to the completely melted silicon material and starting pulling up the monocrystalline silicon.

2. The manufacturing method of monocrystalline silicon according to claim 1, wherein the monocrystalline silicon is pulled up without decreasing an intensity of the horizontal magnetic field below a predetermined value after the pulling up of the monocrystalline silicon is started until the pulling up of the monocrystalline silicon is completed.

3. A monocrystalline silicon pull-up device comprising:
a chamber;
a quartz crucible disposed in the chamber;
a heat shield covering an upper part of the quartz crucible;
a gas inlet through which an inert gas is introduced into the chamber, the gas inlet being provided at an upper part of the chamber;
a magnetic field applying portion configured to apply a horizontal magnetic field to a silicon melt in the quartz crucible; and
a crystal pull-up axis configured to pull up monocrystalline silicon, the crystal pull-up axis being provided above the quartz crucible,
wherein:
a cut is formed in the heat shield,
a distance between a surface of the silicon melt and a lower end of the heat shield is partially changed, or
an eccentric elliptical shaped bore through which the monocrystalline silicon passes is formed in the heat shield, so that the heat shield is plane asymmetric with respect to the plane defined by the crystal pull-up axis and the application direction of the horizontal magnetic field and is rotationally asymmetric with respect to the crystal pull-up axis; and
the monocrystalline silicon pull-up device is configured to be capable of forming a flow distribution of a flow of the inert gas flowing between a lower end of the heat shield and a surface of the silicon melt in the quartz crucible, the flow distribution being plane asymmetric with respect to the plane defined by the crystal pull-up axis of the pull-up device and the application direction of the horizontal magnetic field and the flow distribution being rotationally asymmetric with respect to the crystal pull-up axis.

4. A monocrystalline silicon pull-up device comprising:
a chamber;
a quartz crucible disposed in the chamber;
a heat shield covering an upper part of the quartz crucible;
a gas inlet through which an inert gas is introduced into the chamber, the gas inlet being provided at an upper part of the chamber;
a magnetic field applying portion configured to apply a horizontal magnetic field to a silicon melt in the quartz crucible;
a crystal pull-up axis configured to pull up monocrystalline silicon, the crystal pull-up axis being provided above the crucible, and
one or more exhaust outlets through which the inert gas is discharged, the one or more exhaust outlets being provided at a lower part of the chamber,
wherein:
the one or more exhaust outlets differ in any of exhaust area, shape, position, and number so that the one or more exhaust outlets are asymmetrically configured with respect to the crystal pull-up axis, and
the monocrystalline silicon pull-up device is configured to be capable of forming a flow distribution of a flow of the inert gas flowing between a lower end of the heat shield and a surface of the silicon melt in the quartz crucible, the flow distribution being plane asymmetric with respect to the plane defined by the crystal pull-up axis of the pull-up device and the application direction of the horizontal magnetic field and the flow distribution being rotationally asymmetric with respect to the crystal pull-up axis.

5. The manufacturing method of monocrystalline silicon according to claim 1, wherein the flow distribution forms an angle in a range from 45 to 135 degrees with respect to the plane defined by the crystal pull-up axis of the pull-up device and the application direction of the horizontal magnetic field.

6. The manufacturing method of monocrystalline silicon according to claim 1, wherein the horizontal magnetic field is applied to the completely melted silicon material after it is judged whether a convection flow in the silicon melt is anticlockwise or clockwise with respect to a direction of the horizontal magnetic field, and then the pulling up of the monocrystalline silicon is started.

7. The monocrystalline silicon pull-up device according to claim 3, wherein the heat shield provided with the cut is installed so that the cut has an angle from 45 to 135 degrees with respect to the plane defined by the crystal pull-up axis and the application direction of the horizontal magnetic field.

* * * * *